(12) United States Patent
King et al.

(10) Patent No.: US 11,251,076 B2
(45) Date of Patent: Feb. 15, 2022

(54) CONFORMAL LOW TEMPERATURE HERMETIC DIELECTRIC DIFFUSION BARRIERS

(71) Applicant: Intel Corporation, Santa Clara, CA (US)

(72) Inventors: Sean King, Beaverton, OR (US); Hui Jae Yoo, Portland, OR (US); Sreenivas Kosaraju, Portland, OR (US); Timothy Glassman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 16/940,004

(22) Filed: Jul. 27, 2020

(65) Prior Publication Data

US 2020/0357687 A1     Nov. 12, 2020

Related U.S. Application Data

(60) Continuation of application No. 16/702,233, filed on Dec. 3, 2019, now Pat. No. 10,763,161, which is a
(Continued)

(51) Int. Cl.
*H01L 21/76*     (2006.01)
*H01L 23/52*     (2006.01)
(Continued)

(52) U.S. Cl.
CPC ...... *H01L 21/76831* (2013.01); *H01L 21/022* (2013.01); *H01L 21/0228* (2013.01);
(Continued)

(58) Field of Classification Search
CPC ......... H01L 21/76831; H01L 21/76877; H01L 23/5226; H01L 23/53228; H01L 23/564;
(Continued)

(56) References Cited

U.S. PATENT DOCUMENTS 6,159,845 A    12/2000  Yew
6,537,923 B1   3/2003   Bhatt
(Continued)

FOREIGN PATENT DOCUMENTS

| CN | 101483171 | 7/2009 |
|---|---|---|
| KR | 10-2011-0094205 | 8/2011 |
| WO | WO-2010065410 | 6/2010 |

OTHER PUBLICATIONS

Final Office Action from Korean Patent Application No. 10-2020-7011108, dated Nov. 27, 2020, 6 pgs., no translation.
(Continued)

*Primary Examiner* — Sheikh Maruf
(74) *Attorney, Agent, or Firm* — Schwabe, Williamson & Wyatt, P.C.

(57) ABSTRACT

Conformal hermetic dielectric films suitable as dielectric diffusion barriers over 3D topography. In embodiments, the dielectric diffusion barrier includes a dielectric layer, such as a metal oxide, which can be deposited by atomic layer deposition (ALD) techniques with a conformality and density greater than can be achieved in a conventional silicon dioxide-based film deposited by a PECVD process for a thinner contiguous hermetic diffusion barrier. In further embodiments, the diffusion barrier is a multi-layered film including a high-k dielectric layer and a low-k or intermediate-k dielectric layer (e.g., a bi-layer) to reduce the dielectric constant of the diffusion barrier. In other embodiments a silicate of a high-k dielectric layer (e.g., a metal silicate) is formed to lower the k-value of the diffusion barrier by adjusting the silicon content of the silicate while maintaining high film conformality and density.

20 Claims, 7 Drawing Sheets

Related U.S. Application Data continuation of application No. 16/538,666, filed on Aug. 12, 2019, now Pat. No. 10,529,619, which is a continuation of application No. 15/926,870, filed on Mar. 20, 2018, now Pat. No. 10,438,844, which is a continuation of application No. 15/686,047, filed on Aug. 24, 2017, now Pat. No. 9,935,002, which is a continuation of application No. 15/141,522, filed on Apr. 28, 2016, now Pat. No. 9,754,821, which is a division of application No. 13/976,835, filed as application No. PCT/US2011/066252 on Dec. 20, 2011, now Pat. No. 9,330,963.

(51) Int. Cl.
| | | |
|---|---|---|
| *H01L 21/02* | (2006.01) | |
| *H01L 21/768* | (2006.01) | |
| *H01L 23/522* | (2006.01) | |
| *H01L 23/532* | (2006.01) | |
| *H01L 23/00* | (2006.01) | |

(52) U.S. Cl.
CPC .... *H01L 21/02178* (2013.01); *H01L 21/7682* (2013.01); *H01L 21/76802* (2013.01); *H01L 21/76829* (2013.01); *H01L 21/76877* (2013.01); *H01L 23/522* (2013.01); *H01L 23/5222* (2013.01); *H01L 23/5226* (2013.01); *H01L 23/53228* (2013.01); *H01L 23/53295* (2013.01); *H01L 23/564* (2013.01); *H01L 2924/0002* (2013.01)

(58) Field of Classification Search
CPC .......... H01L 23/5222; H01L 23/53295; H01L 21/7682; H01L 21/76829; H01L 21/76802; H01L 23/522; H01L 21/02178; H01L 21/022; H01L 21/0228; H01L 2924/0002; H01L 21/02304
USPC ........ 257/741, 773, 774, 459, 211; 438/612, 438/622, 624, 396, 381, 733
See application file for complete search history.

(56) References Cited

U.S. PATENT DOCUMENTS

| | | | |
|---|---|---|---|
| 6,541,367 | B1 | 4/2003 | Mandal |
| 6,664,186 | B1 | 12/2003 | Callegari et al. |
| 6,713,846 | B1 | 3/2004 | Senzaki |
| 6,967,405 | B1 | 11/2005 | Yu |
| 6,984,591 | B1 | 1/2006 | Bushanan |
| 7,473,632 | B2 | 1/2009 | Ueda |
| 7,576,006 | B1 | 8/2009 | Yu |
| 7,749,891 | B2 | 7/2010 | Ueda |
| 7,830,014 | B2 | 11/2010 | Ueda |
| 2001/0040267 | A1 | 11/2001 | Lien et al. |
| 2002/0016058 | A1 | 2/2002 | Zhao |
| 2004/0011286 | A1 | 1/2004 | Kwon |
| 2004/0092073 | A1 | 5/2004 | Cabral, Jr. et al. |
| 2004/0097065 | A1 | 5/2004 | Lur |
| 2004/0113235 | A1 | 6/2004 | Coolbaugh |
| 2004/0119163 | A1 | 6/2004 | Wong |
| 2004/0124531 | A1 | 7/2004 | Venkatraman |
| 2004/0135255 | A1 | 7/2004 | Matsunaga |
| 2004/0207064 | A1 | 10/2004 | Brooks et al. |
| 2004/0207084 | A1 | 10/2004 | Hedrick |
| 2005/0124154 | A1 | 6/2005 | Park |
| 2005/0153505 | A1 | 7/2005 | Gambino |
| 2005/0191862 | A1 | 9/2005 | Strane |
| 2005/0221554 | A1 | 10/2005 | Huang |
| 2005/0230831 | A1 | 10/2005 | Clevenger |
| 2005/0242435 | A1 | 11/2005 | Werking |
| 2005/0260850 | A1 | 11/2005 | Loke |
| 2006/0043591 | A1 | 3/2006 | Yim |
| 2006/0088975 | A1 | 4/2006 | Ueda |
| 2006/0138603 | A1 | 6/2006 | Cabral, Jr. et al. |
| 2006/0141778 | A1 | 6/2006 | Tonegawa |
| 2006/0199386 | A1 | 9/2006 | Huang |
| 2007/0096226 | A1 | 5/2007 | Liu et al. |
| 2007/0111509 | A1 | 5/2007 | Huang |
| 2007/0155161 | A1 | 7/2007 | Ramachandrarao |
| 2007/0161226 | A1 | 7/2007 | Dalton et al. |
| 2007/0178713 | A1 | 8/2007 | Jeng |
| 2007/0222081 | A1 | 9/2007 | Chen |
| 2008/0026567 | A1 | 1/2008 | Greco |
| 2008/0070396 | A1 | 3/2008 | Budrevich |
| 2008/0122103 | A1 | 5/2008 | Bonilla |
| 2008/0128907 | A1 | 6/2008 | Yang |
| 2008/0203574 | A1 | 8/2008 | Kobayashi |
| 2008/0254641 | A1 | 10/2008 | Kobayashi |
| 2009/0085172 | A1 | 4/2009 | Horigome |
| 2009/0160020 | A1 | 6/2009 | Barth |
| 2009/0197404 | A1 | 8/2009 | Yang |
| 2009/0224374 | A1 | 9/2009 | Bhatia |
| 2009/0233226 | A1 | 9/2009 | Allen |
| 2010/0038782 | A1 | 2/2010 | Yang |
| 2010/0055898 | A1 | 3/2010 | Chang et al. |
| 2010/0093168 | A1 | 4/2010 | Naik |
| 2010/0130001 | A1 | 5/2010 | Noguchi |
| 2010/0164111 | A1 | 7/2010 | Yang |
| 2011/0100697 | A1 | 5/2011 | Yang |
| 2011/0108992 | A1 | 5/2011 | Chanda et al. |
| 2011/0115026 | A1 | 5/2011 | Jagannathan et al. |
| 2011/0135557 | A1 | 6/2011 | Rangarajan |
| 2011/0156129 | A1 | 6/2011 | Fumitake |
| 2011/0263117 | A1 | 10/2011 | Nam |
| 2011/0291284 | A1 | 12/2011 | Goldfarb |
| 2012/0080792 | A1 | 4/2012 | Zhao |
| 2014/0042627 | A1 | 2/2014 | Edelstein et al. |
| 2014/0061930 | A1* | 3/2014 | Holmes ............ H01L 21/76807 257/769 |
| 2014/0110845 | A1 | 4/2014 | Su |
| 2014/0210058 | A1* | 7/2014 | Lee ................... H01L 21/76877 257/657 |
| 2014/0239499 | A1* | 8/2014 | Okuyama .............. H01L 24/94 257/741 |
| 2014/0252615 | A1* | 9/2014 | Saito ................ H01L 21/76876 257/741 |
| 2015/0061134 | A1* | 3/2015 | Lee ................... H01L 21/76895 257/751 |
| 2015/0069608 | A1* | 3/2015 | Collins ................ H01L 23/528 257/741 |
| 2015/0091172 | A1* | 4/2015 | Ko .................... H01L 23/53295 257/741 |
| 2015/0091175 | A1 | 4/2015 | Chandhok |
| 2015/0187670 | A1* | 7/2015 | Ono .................. H01L 21/31133 257/741 |
| 2015/0228537 | A1* | 8/2015 | Chang ............... H01L 21/76814 257/741 |
| 2015/0228586 | A1* | 8/2015 | Usami .............. H01L 21/76826 257/751 |
| 2015/0255375 | A1 | 9/2015 | Knight |
| 2015/0294905 | A1* | 10/2015 | Wu ................... H01L 21/76831 257/741 |
| 2015/0294938 | A1* | 10/2015 | Chen ................. H01L 23/3107 257/741 |
| 2016/0049370 | A1* | 2/2016 | Kamineni ......... H01L 21/76831 257/741 |
| 2016/0111382 | A1 | 4/2016 | Aubel |
| 2016/0358816 | A1 | 12/2016 | Su |

OTHER PUBLICATIONS

Office Action from Korean Patent Application No. 10-2020-7007252, dated Nov. 27, 2020, 5 pgs., no translation.
Notice of Allowance from Chinese Patent Application No. 201710356176.4, dated Nov. 4, 2020, 4 pages, with English translation.
First Office Action for Chinese Patent Application No. 201180076399.6 dated Jan. 5, 2016, 7 pgs., no translation.

(56) References Cited

OTHER PUBLICATIONS

R. Ponchel et al. "Comparison of the benefits, from SiO2 to ultralow-K dielectric and air spacing introduction, in term of Interconnects performances, for the future high speed tc's in a multicoupled lines system", SPI2007, pp. 25-28.
Second Office Action for Chinese Patent Application No. 201180076399.6 dated Sep. 26, 2016, 3 pgs., no translation.
Notice of Grant for Chinese Patent Application No. 201180076399.6 dated Mar. 6, 2017, 4 pgs., English translation.
Office Action from Chinese Patent Application No. 201710356176.4, dated Dec. 28, 2018, 13 pgs.
First Office Action for Korean Patent Application No. 10-2014-7017936 dated Jul. 21, 2015, 6 pgs., no translation.
Third Office Action for Korean Patent Application No. 10-2014-7017936 dated Jul. 22, 2016, 6 pgs., English translation.
Second Office Action for Korean Patent Application No. 10-2014-7017936 dated Jan. 12, 2016, 6 pgs., no translation.
Notice of Allowance for Korean Patent Application No. 10-2014-7017936 dated Sep. 28, 2016, 3 pgs., no translation.
Office Action for Korean Patent Application No. 10-2016-7035623 dated Mar. 10, 2017, 6 pgs., English translation.
Non-Final Office Action for Korean Patent Application No. 10-2016-7035623 dated Sep. 26, 2017, 6 pgs., with English translation.
Intellectual Property Trial and Appeal Board for Korean Patent Application No. 10-2016-7035623, dated Apr. 2, 2019, 18 pgs.
Non-Final Office Action for Korean Patent Application No. 10-2017-7031268 dated Feb. 7, 2018, 8 pgs., with English translation.
Final Office Action for Korean Patent Application No. 10-2017-7031268 dated Aug. 21, 2018, 7 pgs., English translation.
Final Office Action for Korean Patent Application No. 10-2017-7031268 dated Sep. 28, 2018, 7 pgs., English translation.
Office Action for Korean Patent Application No. 10-2018-7031372, dated Feb. 18, 2019, 3 pgs.
International Search Report and Written Opinion dated Sep. 27, 2012, for PCTUS2011/066252 filed Dec. 20, 2011, 10 pages.
PCT Notification concerning Transmittal of International Preliminary Report on Patentability (Chapter 1 of the Patent Cooperation Treaty) for PCT Counterpart Application No. PCT/US2011/066252, 7 pgs., (dated Jul. 3, 2014).
F. Chen et al., The Effect of Metal Area and Lines Spacing on TDDB Characteristics of 45nm Low-k SiCOH Dielectrics, IIEE 4511 Annual International Reliability Physics Symposium, Phoenix, 2007, pp. 382-389.
Non-Final Office Action for U.S. Appl. No. 15/141,522 dated Oct. 4, 2016, 12 pgs.
Notice of Allowance and Fees for U.S. Appl. No. 15/686,047 dated Dec. 8, 2017, 13 pgs.
Notice of Allowance and Fees for U.S. Appl. No. 15/141,522 dated May 5, 2017, 17 pgs.
Office Action from Chinese Patent Application No. 201710356176.4, dated Jul. 11, 2019, 7 pages.
Office Action from Korean Patent Application No. 10-2018-7031372, dated Aug. 2, 2019, 5 pages.
Office Action from Chinese Patent Application No. 201710356176.40, dated Jan. 17, 2020, 8pgs.
Office Action from Korean Patent Application No. 10-2020-7007252, dated May 7, 2020, 9 pgs.
Office Action from Korean Patent Application No. 10-2020-7011108, dated May 27, 2020, 9 pgs.
Office Action from Chinese Patent Application No. 201710356176.4, dated Jun. 15, 2020, 12 pages.
Office Action from Korean Patent Application No. 10-2017-7031268, dated Mar. 18, 2020, 17 pgs.

* cited by examiner

US 11,251,076 B2

CONFORMAL LOW TEMPERATURE HERMETIC DIELECTRIC DIFFUSION BARRIERS

CLAIM OF PRIORITY

The present application is a continuation of co-pending U.S. patent application Ser. No. 16/702,233, filed Dec. 3, 2019, which is a continuation of co-pending U.S. patent application Ser. No. 16/538,666, filed Aug. 12, 2019, now U.S. Pat. No. 10,529,619 issued Jan. 7, 2020, which is a continuation of co-pending U.S. patent application Ser. No. 15/926,870, filed Mar. 20, 2018, now U.S. Pat. No. 10,438,844 issued Oct. 8, 2019, which is a continuation of co-pending U.S. patent application Ser. No. 15/686,047, filed Aug. 24, 2017, now U.S. Pat. No. 9,935,002 issued on Apr. 3, 2018, which is a continuation of co-pending U.S. patent application Ser. No. 15/141,522, filed Apr. 28, 2016, now U.S. Pat. No. 9,754,821 issued on Sep. 5, 2017, which is a divisional of co-pending U.S. patent application Ser. No. 13/976,835, filed Jun. 27, 2013, now U.S. Pat. No. 9,330,963 issued on May 3, 2016, which is a U.S. National Phase application under 35 U.S.C. § 371 of International Application No. PCT/US2011/066252, filed Dec. 20, 2011, entitled "Conformal Low Temperature Hermetic Dielectric Diffusion Barriers" the entire contents of which are hereby incorporated by reference herein.

TECHNICAL FIELD

Embodiments of the present invention generally relate to semiconductor devices, and more particularly to conformal dielectric diffusion barriers.

BACKGROUND

Microelectronic devices, such as integrated circuits incorporating metal-oxide-semiconductor transistors (MOSFETs), or the like, continue to scale by reducing pitches between adjacent features and incorporating three-dimensional transistor structures (e.g., finFETs). As transistor density and non-planarity increases, so too does the interconnect metallization, increasing interconnect capacitance and making electrical isolation more difficult. Interconnect processes over the last decade have increasingly incorporated "low-k" films (e.g., those below ~3.2) as the material of choice of inter-level dielectrics (ILDs), some further implementing air gap formation whereby voids in the ILD between adjacent metal lines are deliberately introduced. Also, topography present due to radical 3D structures may induce voids and/or defects that need to be sealed/covered by a conformal dielectric layer.

Plasma enhanced chemical vapor deposition (PECVD) processes are typically used for dielectric deposition in low-k interconnect applications but do not offer high conformality/step coverage. For example, a PECVD low-k film typically has conformality less than 55% (e.g., only approaching 75% with a dep/etch/dep type sequence) where a dielectric has deposited thickness on vertical (e.g., sidewall) surface that is less than 55% of the deposited thickness on a horizontal (e.g., top) surface. CVD or low pressure CVD (LPCVD) techniques offer higher conformality, but require temperatures higher than typically permissible for low-k interconnect applications.

It is often desirable to provide a hermetic seal with a dielectric layer, for example to prevent out-diffusion of metal (e.g., Cu) from a metal interconnect line into surrounding ILD material, as well as to prevent moisture and wet chemical in-diffusion from surrounding ILD (or from a void in an air gap formation process) into a 3D structure (e.g., metal line, transistor, etc.). Due to difficulties in achieving perfect coverage and film densification over 3D topography, there is therefore a minimum thickness requirement for a dielectric diffusion barrier.

Materials and techniques to reduce a dielectric diffusion barrier minimum thickness are therefore advantageous.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1:
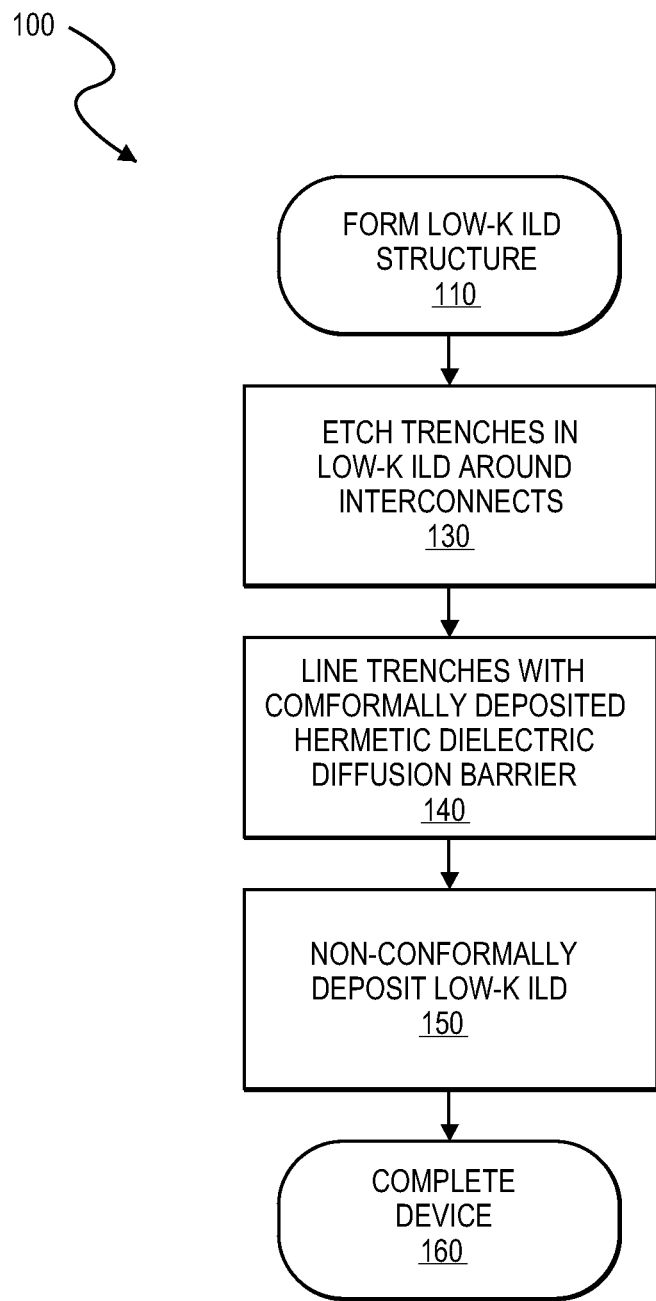
FIG. 1 is a flow diagram illustrating a method of forming a dielectric diffusion barrier, in accordance with an embodiment.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are conformal hermetic dielectric films suitable for dielectric diffusion barriers over 3D topography. In embodiments, the dielectric diffusion barrier is a dielectric layer which is deposited by atomic layer deposition (ALD) techniques to achieve a conformality of at least 95% for a thinner contiguous diffusion barrier than can be achieved in a conventional silicon dioxide/nitride/carbide-based film, for example deposited by PECVD or by a repetitive deposition/sputter plasma enhanced chemical vapor deposition (PECVD) process capable of a conformality of no more than 75%. Because the ALD dielectric layer may have a relatively higher dielectric constant than such PECVD films, it may be counter intuitive to employ such a material in structures sensitive to capacitance, however it has been found the excellent step coverage and greater mass/atomic density of certain "high-k" dielectric layer materials enables a hermetic diffusion barrier of reduced thickness. Generally, this high mass and/or high atomic density implies no (or very low) porosity with interstitial spaces in the barrier material being of such a small dimension that it is difficult for diffusing atoms to pass through the barrier material (i.e., a more tortuous diffusion path).

Thus, for a diffusion barrier, the tradeoff between a moderate k film with only moderately good step coverage and hermeticity and a higher k film with better step coverage and hermeticity can be made favorable. For example, in certain applications, this reduction in thickness of the diffusion barrier enables a net reduction in capacitance of a structure (e.g., an interconnect ILD level) by increasing an available volume for an extremely low dielectric (e.g., a volume for an air gap).

In further embodiments, the dielectric constant of the diffusion barrier is advantageously reduced by where the barrier is made a multi-layered film including the relatively high-k ALD layer and a low-k or intermediate-k dielectric layer (e.g., a bi-layer). In other embodiments a silicate of the relatively high-k ALD layer is formed to take advantage of the conformality and density of the ALD dielectric, but lower the k-value of the diffusion barrier by adjusting the silicon content of the silicate.

FIG. 1 is a flow diagram illustrating a method 100 for forming a dielectric diffusion barrier, in accordance with an embodiment where interconnect metallization in ILD incorporates air gaps between adjacent metal structures of a same metallization layer (e.g., metal lines). A dielectric diffusion barrier is disposed between the air gap sidewalls of the metal lines to protect the interconnect metallization. While the exemplary interconnect embodiments serves as useful illustrations, it is noted that the dielectric diffusion barrier materials and deposition techniques described in the exemplary interconnect context are applicable in many other contexts where a dense, conformal hermetic dielectric diffusion barrier is needed over severe 3D topography. For example, one of skill in the art may readily implement the teachings provided herein to form a diffusion barrier disposed over a finfet, a liner of a shallow trench isolation region, a passivation layer of a waveguide in a photonic integrated circuit, etc. The teachings provided herein are also applicable for some 2D applications such as forming very thin, hermetic Cu capping layers in dual damascene structures.

Figure 2A:
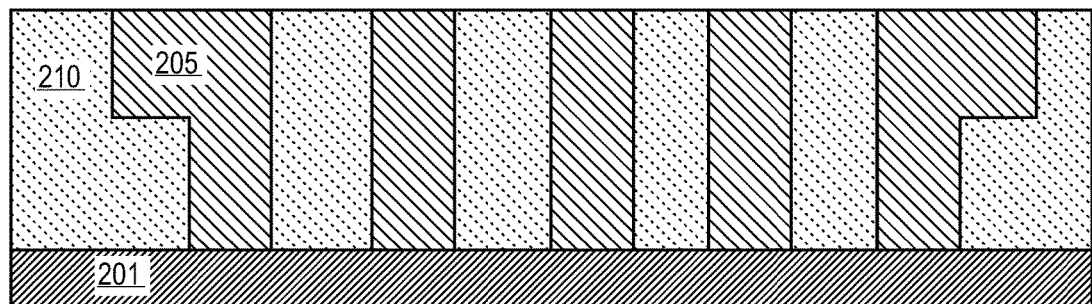
FIGS. 2A, 2B, 2C, 2D, 2E, 2F, 2G, and 2H illustrate side views of a cross section through an IC fabricated in accordance with an embodiment of the method illustrated in FIG. 1.

Method 100 begins at operation 110 with the formation of a low-k ILD structure. FIG. 2A illustrates a side view of a cross section through an integrated circuit (IC), such as a microprocessor or other logic device, fabricated in accordance with an embodiment of the method 100. In FIG. 2A, transistors of the IC are disposed in the substrate 201. The substrate 201 may include any conventional semiconductor substrate (e.g., silicon, Ge, SiGe, SiC, GaAs, InP, GaN, etc.), whether in a bulk or SOI format, as wells as polymer substrates (e.g. in TFT applications). Transistors disposed in the substrate 201 may be of any conventional design, such as, but not limited to, planar or non-planar MOSFETs, planar or non-planar high electron mobility transistors (HEMTs), etc.

Disposed over the substrate 201 is a low-k ILD structure comprising a low-k dielectric layer 210 in which a first metal interconnect level 205 is embedded, for example by any dual damascence process known in the art. In the exemplary embodiment, the low-k dielectric layer 210 is a carbon-doped oxide (SiOC:H) having a dielectric constant in the range of 2.5-3.2, depending on porosity. Of course, other known low-k ILD materials may also be utilized, and indeed in the exemplary embodiment where the low-k dielectric layer 210 is in some respects is sacrificial (as discussed elsewhere herein), it is also possible to uses in place of the low-k dielectric layer 210 a layer of a convention moderate-k dielectric material, such as $SiO_2$, PSG, BPSG, SiOF, etc. In embodiments, each metal interconnect line 205 comprises a barrier layer, such as tantalum (Ta) or TiN, and a fill metal, such as copper (Cu) or tungsten (W).

Figure 2B:
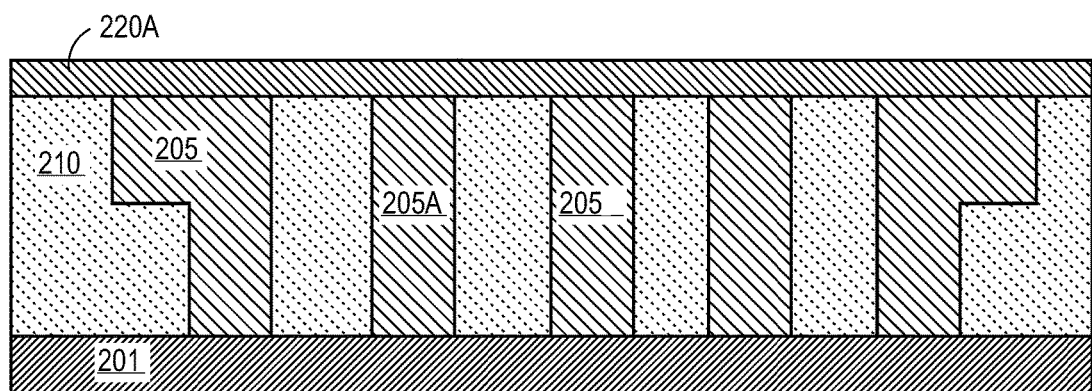

Continuing with the method 100, at operation 130 trenches are etched into the low-k ILD around the metal interconnects. Generally, operation 130 entails rendering a planar damascene layer non-planar for the sake of introducing voids into spaces between the metal interconnect lines. It is this introduction of extreme topography which provides an exemplary impetus for the highly conformal dielectric diffusion barriers described herein. As one example of forming such trenches, FIG. 2B illustrates a side view of a cross section through the integrated circuit (IC) illustrated in FIG. 2A following deposition of a hard mask layer 220A over the low-k ILD structure. The hard mask layer 220A may be any material known in the art to be suitable for such purposes, such as, but not limited to, a low-k SiN:H, SiC:H, SiOC:H, SiCN:H, or SiOCN:H (as the hard mask layer 220A is typically deposited by PECVD, a significant amount of hydrogen is incorporated into the films). The thickness of the hard mask layer 220A may range from about 2-50 nm and dielectric constant (k) of the material may range from 4-7. In the exemplary embodiment, thickness is about 8 nm and k is about 4.8. Notably, in addition to aiding patterning, the hardmask layer 220A also serves to protect the top surface of the metal interconnects from oxidation and corrosion during fabrication. In exemplary embodiment, the hardmask layer 220A is non-sacrificial, remaining in place to passivate the (Cu) surface of the metal interconnects and should therefore have good adhesion to minimize mechanical and electromigration failures.

Figure 2C:
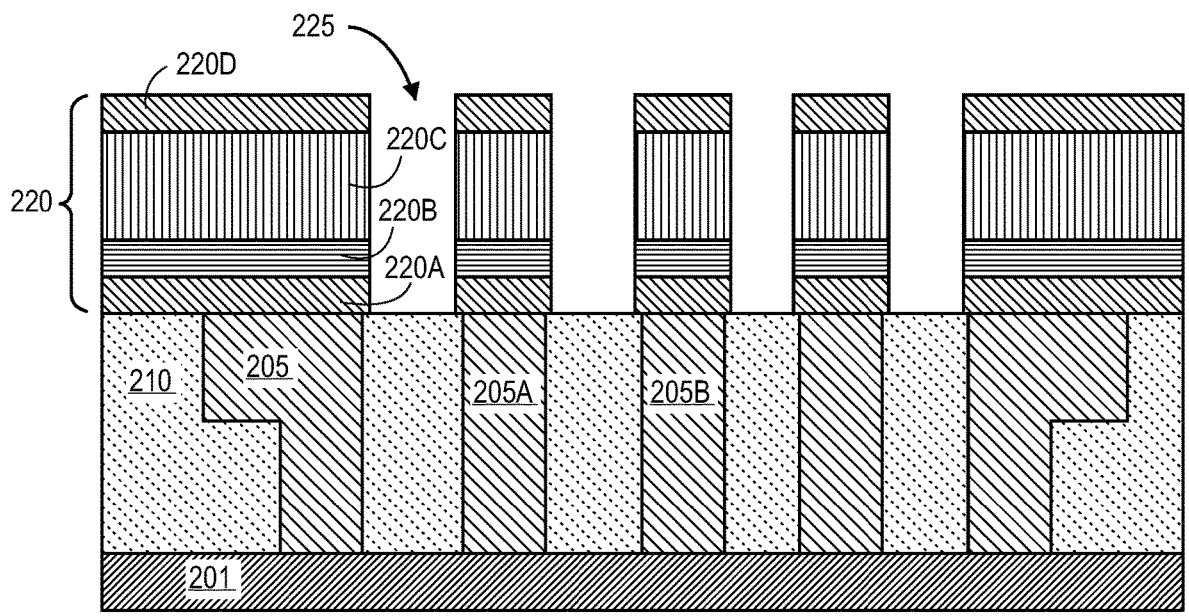

Continuing with the exemplary implementation of operation 130, FIG. 2C illustrates a deposition of additional masking layers to form a multi-layered mask and patterning of the multi-layered mask. Disposed over the hard mask layer 220A is a second hard mask layer 220B, such as, but not limited to, amorphous carbon (α-C:H), TiN, or TaN.

Over the second hard mask layer 220B is any conventional photoresist 220C, and an organic anti-reflective coating (ARC), and/or dielectric ARC (DARC) 220D, such as, but not limited to a silicon-containing material like silicon dioxide, silicon nitride, carbon doped oxide, etc. The patterning is such that openings 225 are formed over the low-k dielectric layer 210 in the spaces between two adjacent metal interconnect lines (e.g., 205A and 205B).

Figure 2D:
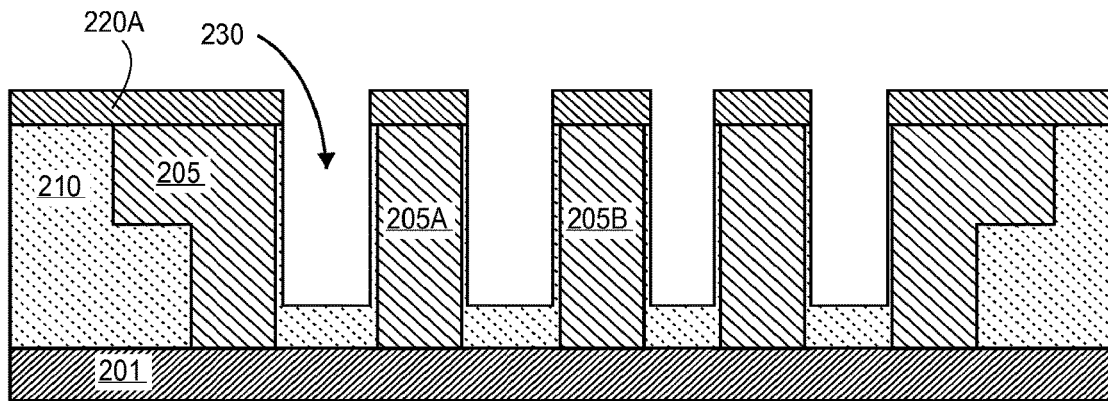

FIG. 2D completes the exemplary implementation of operation 130 with etching of the trenches 230 in the low-k dielectric 210 disposed between adjacent metal interconnect lines 205A, 205B. Any plasma-based etches, such as but not limited to fluorinated chemistries ($CF_4$, $C_2F_6$, $CF_3H$, etc.) may be utilized to etch trenches 230 to extend at least partially through the (partially sacrificial) low-k ILD layer 210 from a top surface of the low-k dielectric layer 210, and may extend completely through the low-k dielectric layer 210 to expose the substrate 201. It is, of course, understood that the trench 230 can also be formed by any other known technique such as, but not limited to, ion milling and laser ablation. The photoresist 220C, second hardmask layer 220B (e.g., TiN), and the other patterning materials are then removed using any combination of dry plasma etching and wet chemical cleans known in the art (typically by an oxygen plasma or hydrogen plasma followed by a wet clean). Following the completion of operation 130, and as illustrated in FIG. 2D, the low-k ILD structure now includes extreme 3D topography with metal interconnect lines (e.g., Cu) extending upward around trenches (vias) inlaid into the metal interconnect lines 205 where portions of the low-k dielectric layer 210 have been removed. In embodiments, the trench 230 has an aspect ratio of at least 5:1 and greater than 7:1 in the exemplary embodiment. Notably, although the hardmask layer 220A is retained as a non-sacrificial layer in the exemplary embodiment, the hard mask layer 220A may not remain intact due to corner rounding during the etching of the trench 230 or may be completely removed by subsequent processing.

Figure 2E:
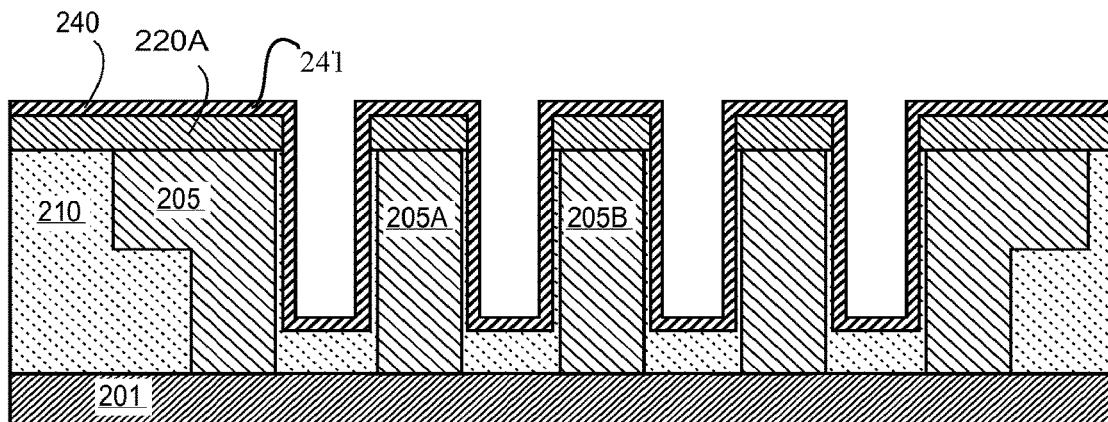

Returning to FIG. 1, the method 100 continues with conformally depositing a hermetic dielectric diffusion barrier. In the exemplary interconnect embodiment, illustrated in FIG. 2E shows the dielectric diffusion barrier 240 forms a contiguous liner in the trench 230, spanning the space between adjacent metal interconnect lines 205A, 205B, as well as covering the hardmask layer 220A.

In an embodiment, at least a portion of the hermetic dielectric diffusion barrier 240 is deposited with an ALD process. Though ALD is generally known in the art, it is limited in application by the practical constraints imposed by the availability of acceptable precursors capable of self-limiting reactions to form a film of the desired composition. Thus, while the widespread availability of certain pre-cursors has enabled ALD to become a popular technique for the formation of gate dielectric layers, such has not been true for dielectric materials employed in typical interconnect isolation capacities. For this reason, plasma enhanced ALD (PEALD), a quasi-ALD technique, has been investigated as a means to deposit a wider variety of materials, but films produced by this technique have been found to be uniformly hermetic only at thickness greater than about 16 nm and therefore the quasi-ALD technique is not particularly advantageous for dielectric diffusion barriers. Hermetic barriers at thicknesses less than 5 nm are only possible with PECVD/PEALD technique where the film is deposited on perfectly flat surfaces because of densification of the film from through ion bombardment during the deposition or sputter treatments. However, because this ion bombardment is highly direction, film deposited on ion shadowed surfaces (e.g., near vertical surfaces) are of lower density and not hermetic. In the exemplary embodiments described herein, a true ALD process is employed to form a dielectric diffusion barrier that is hermetic at thicknesses below 10 nm, more particularly below 8 nm, and most particularly below 6 nm. With the high conformality of the ALD process (e.g., 95% or more), it is possible to establish a contiguous, pin-hole free film over extreme 3D topography at these very low film thicknesses.

In an embodiment, prior to depositing the dielectric diffusion barrier 240, a dielectric material is deposited by PECVD to avoid direct exposure of any exposed surface of the metal interconnect lines (e.g., Cu) which might be adversely affected by direct exposure to an ALD precursor. If the hardmask 220A is fully in place and some amount of low-k ILD is preserved on the interconnect line sidewall, the top surface and liner of the interconnect line may be protected. However due to imperfections, some low-k ILD may not remain on the sidewall and the top interconnect surface may be exposed to corner clipping, partial etching or complete removal of the hardmask 220. Also, low-k ILDs are pour barriers and oxidation of the interconnect liner (Ta/TaN) remains a possiblity regardless. Exemplary dielectric materials suitable for this purpose, include, but are not limited to, SiN:H, SiCN:H, SiC:H, SiOC:H (e.g., having a range of dielectric constants described elsewhere herein for the hardmask layer 220A) and may be deposited by PECVD to a thickness preferably less than 2 nm, though alternate embodiments include depositing the low-k interconnect passivation film to greater thicknesses (e.g., 4 nm-16 nm).

In an embodiment, at least a portion of the hermetic dielectric diffusion barrier 240 is an ALD dielectric material that has a relatively high dielectric constant compared to silicon-based PECVD films (e.g., greater than 6). There are many such films known in the art to be formable with the ALD technique and generally any of them may be employed as the dielectric diffusion barrier 240, or a portion thereof. In the exemplary embodiment, the high-k dielectric material is a metal oxide such as, but not limited to, $Al_2O_3$, $MgO_2$, and $HfO_2$, all of which have a dielectric constant well over 10. Other transition metal oxides, such as $TiO_2$, $TaO_2$, and $ZrO_2$, that are also compatible with the ALD technique may be utilized in alternate embodiments.

Employing a true ALD technique, self-limiting reactions are successively performed during the operation 140. For example, a 6-10 nm $Al_2O_3$ film may be deposited as the dielectric diffusion barrier 240 by sequentially pulsing trimethylaluminum (TMA) and $H_2O$ vapor, each precursor participating in a self-limiting reaction to iteratively form a very conformal film. These sequential self-limiting reactions impart the advantageous high conformality to the dielectric diffusion barrier 240 at temperatures below those required to conformally deposit dielectrics in LPCVD processes. Also advantageous, the aluminum atom is large and tightly bonds with neighboring oxygen atoms to form a dense film capable of hermeticity at thicknesses below 8 nm and even below 6 nm (e.g., 3-4 nm). While the exemplary embodiment of $Al_2O_3$ has been experimentally verified, similar performance is expected of $MgO_2$ and $HfO_2$, and may also be expected of other high-k films known in the art to have similar atomic density. Thus, in the exemplary embodiment, ALD is utilized to achieve a contiguous dielectric film over extreme 3D topography even at thicknesses in the 5-10 nm range and the species employed in the ALD technique are ones which form a dense film capable of providing hermeticity at the minimum thickness required to form a physically contiguous film over the topography present.

Figure 2F:
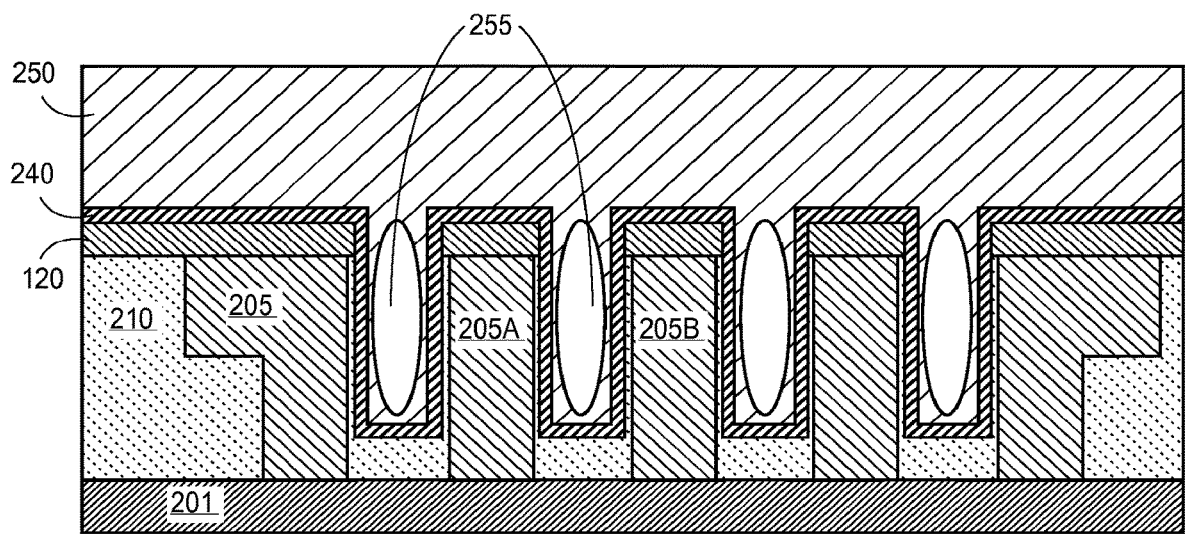
Figure 2G:
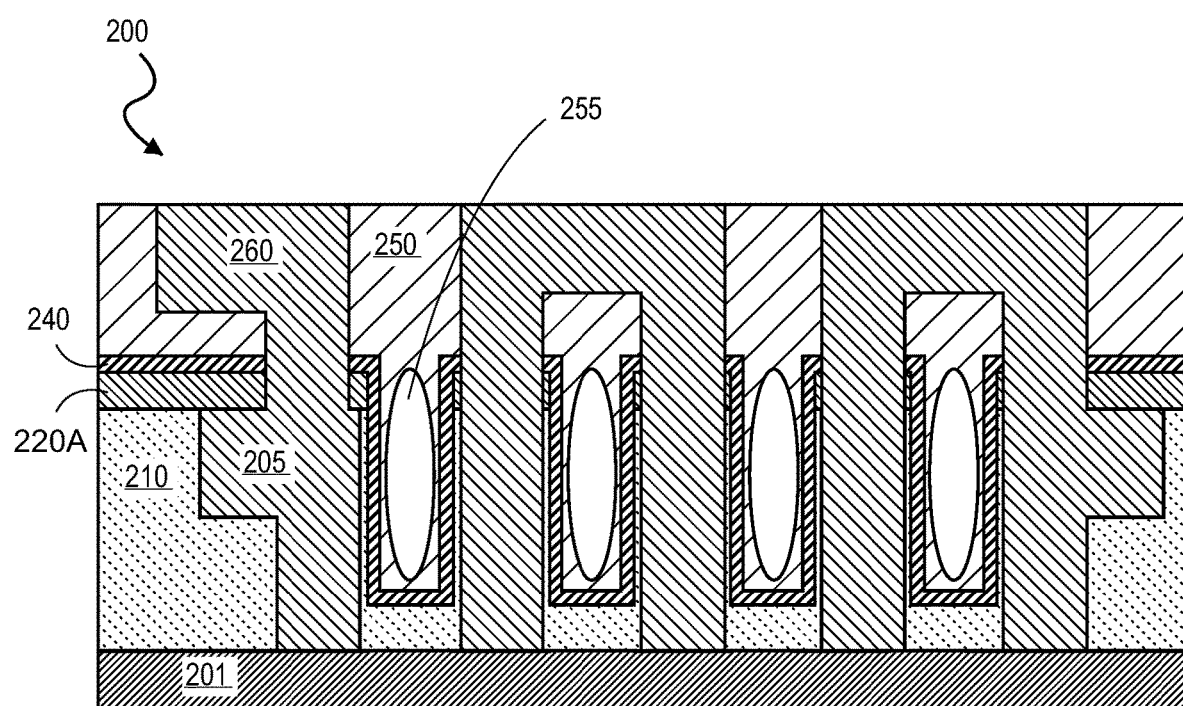
Figure 2H:
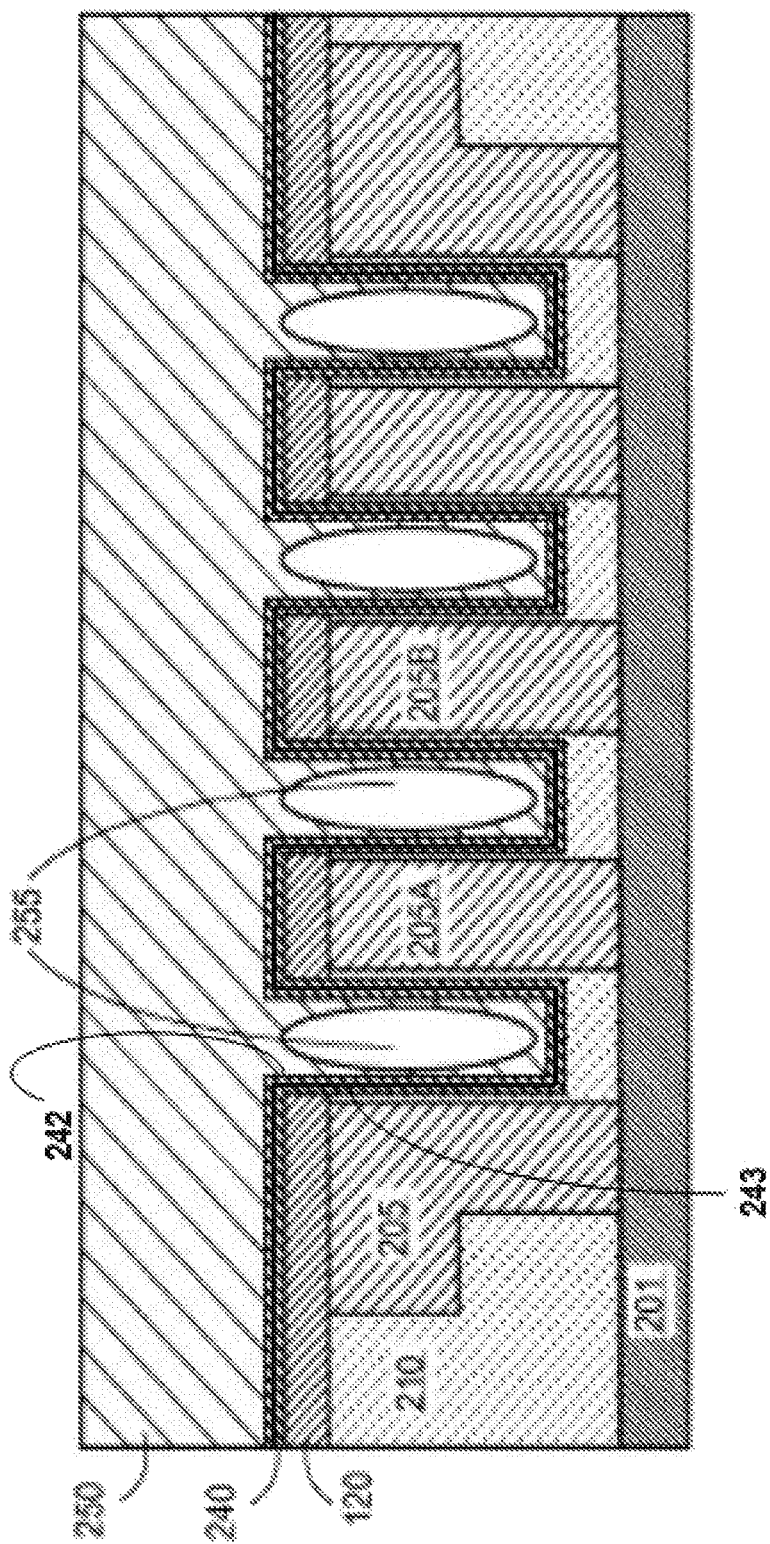

While embodiments employing an ALD dielectric layer may of course include more than one type of dielectric material (e.g., a bi-layer of distinct high-k materials), in an exemplary embodiment, an ALD dielectric layer is coupled with a distinct dielectric material layer having a dielectric constant below that of the ALD material. In one such embodiment, the dielectric diffusion barrier 240 includes at least one metal oxide layer 242, such as $Al_2O_3$, $MgO_2$, and $HfO_2$, and a moderate-k material layer 243 having a dielectric constant below that of the metal oxide but above that of the surrounding low-k dielectric layer (e.g., low-k ILD 210), as shown in FIG. 2H. In an exemplary embodiment, the moderate-k material is SiON(C):H. In such an embodiment the SiON(C):H layer is formed by first depositing by PECVD a SiO(C):H film and then sputter etching that SiO(C):H film with an plasma including a nitrogen source (e.g., one or more of $NH_3$, $N_2$) which sputters away part of the non-conformally deposited material and redistributes it onto topographic sidewalls (e.g,. sidewalls of the trench 230). While the sputter etch densifies the SiOC:H film and incorporates nitrogen to form SiON(C):H, such a film on its own would not be hermetic on ion-shadowed surfaces unless over 15 nm (e.g., 16 nm and above). However, with hermeticity enhanced by the ALD film and the dielectric constant of this moderate-k material being in the range of 4.4-5.5 the dielectric diffusion barrier 240 may have a reduced total capacitance.

In embodiments, the SiON(C):H and ALD dielectric form a bi-layer with either the SiON(C):H forming a first layer or the ALD dielectric forming the first layer. In the exemplary embodiment the bi-layer dielectric diffusion barrier 240 includes a first layer of SiON(C):H and the ALD dielectric as a second layer disposed on the first layer. Exemplary thicknesses of the bi-layer dielectric diffusion barrier 240 are between 5 and 10 nm with the SiON(C):H being between 3 and 6 nm (e.g., slightly more than half the total thickness of the dielectric diffusion barrier 240). In one embodiment where a dielectric layer (e.g., SiOC:H) is first deposited to passivate a metal interconnect line prior to forming the ALD dielectric layer, deposition of the passivating dielectric layer may be transitioned into the first layer of the dielectric diffusion barrier 240 by initiating the nitrogen-based sputter etch process to convert a portion of the passivating dielectric layer into the denser, more conformal SiON(C):H film.

In further embodiments, the dielectric diffusion barrier 240 is a tri-layer film stack 241 in which the ALD dielectric material (not shown) is disposed between PECVD deposited films (e.g., a base layer of SiON(C):H (not shown) as in the case of a bi-layer embodiment and a cap layer of a SiON (C):H) which may improve adhesion and etch profiles in overlying layer deposited in subsequent operations.

In another embodiment, the dielectric diffusion barrier 240 includes a silicon alloy of a metal oxide. The silicon alloy of the metal oxide in the exemplary embodiment is formed by ALD (as opposed to an alloy formed by solid state diffusion of a discretely deposited film stack). In one such embodiment, at least one metal oxide is deposited in conjunction with silicon to form a conformal metal silicate film. In such embodiments, the amount of silicon incorporated into the dielectric diffusion barrier 240 may range from 1-90% (atomic) as selected to achieve a desired reduction in the dielectric constant of dielectric diffusion barrier 240. For example, in one embodiment where the metal oxide is $Al_2O_3$, silicon is introduced to generate a $Al_{1-y}Si_yO_x$ dielectric film. In one exemplary $Al_{1-y}Si_yO_x$ embodiment, the silicon content is at least 50% (atomic) to reduce the dielectric constant of the alloy to below 7 while still providing a hermetic seal at thicknesses below 15 nm, and preferably below 10 nm. For example, during operation 140 an ALD sequence of $TMA/H_2O/SiH_4/H_2O$ may be performed with the duty cycle between TMA and $SiH_4$ varied to achieve the desired silicon content. In alternative embodiments, other metal silicates can be produced by analogous ALD processes incorporating other exemplary metal oxides (e.g., $MgO_2$, $HfO_2$, etc.). In alternative embodiments another alloying species other than silicon is employed to lower the dielectric constant of the dielectric diffusion barrier 240. For example, any of $B_2O_3$, $BeO_2$, $L_{i2}O$, $Na_2O$ might be utilized.

As with a metal oxide layer, the alloyed dielectric utilized in the dielectric diffusion barrier 240 may include a base PECVD layer and/or a cap PECVD layer in addition to the ALD metal silicate layer. For example, a metal silicate layer ($Al_{1-y}Si_yO_x$) may be disposed on a SiN:H, SiC:H, SiOC:H, or SiCN:H film or capped with a SiN:H, SiC:H, SiOC:H, or SiCN:H film. As another example, the metal silicate layer ($Al_{1-y}Si_yO_x$) is disposed between a cap and a base layer of any of SiN:H, SiC:H, SiOC:H, or SiCN:H.

Returning to FIG. 1, method 100 continues at operation 150 with a non-conformal deposition of a low-k or moderate-k (e.g., $SiO_2$, PSG, BPSG, SiOF, polymer, etc.) ILD. In the exemplary interconnect embodiment, it is this non-conformal deposition at operation 150 which is to generate air gaps within the space remaining between the topographic features to reduce the interconnect capacitance relative to the ILD structure illustrated in FIG. 2A. As shown in FIG. 2F, due to the non-conformality of the low-k ILD 250, an air gap 255 is formed between adjacent metal interconnect lines 205A, 205B in the region of the trench 230 not occupied by the dielectric diffusion barrier 240. Hence, it should be clear that reducing the thickness of the dielectric diffusion barrier 240 by 1 unit (e.g., 8 nm) can increase the width of the air gap 255 by 2 units (e.g., 16 nm) and therefore result in a net improvement (i.e., reduction) in capacitance even though a high-k material may be introduced to some extent within the dielectric diffusion barrier 240.

Referring still to FIG. 2F, in embodiments the, low-k ILD 250 is SiOC:H with a dielectric constant in the range of 2.5-3.1. In certain other embodiments, the low-k ILD 250 is a porous film having a dielectric constant below about 2.5. As known, in the art, a chemical-mechanical planarization (CMP) process may be employed to planarized the surface of the low-k ILD 250.

Returning to FIG. 1, the method 100 continues at operation 160 where the device is completed with conventional processing and fabrication techniques know in the art. For example, as illustrated in FIG. 2G, an additional level of metal interconnect 260 is disposed in the low-k ILD 250. As shown, the metal interconnect 260 is coupled to the metal interconnect 205 by a metal-filled (Cu) via passing through the dielectric diffusion barrier 240 and any remaining hardmask layer 220. Additional air-gaps may then be formed in the second-level of metal interconnect substantially as described elsewhere herein in the context of operations 110-150.

Figure 3A:
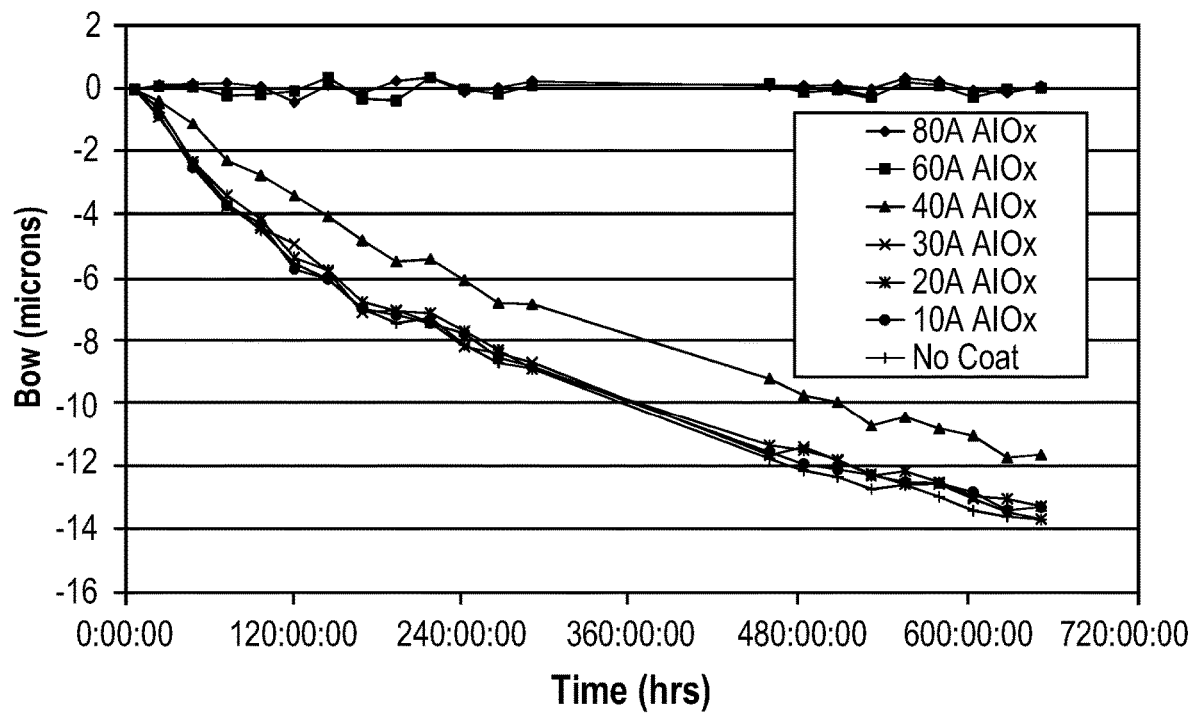
FIGS. 3A-3B illustrate line graphs for experimental evaluations of dielectric diffusion barrier embodiments, in accordance with embodiments of the present invention.
Figure 3B:
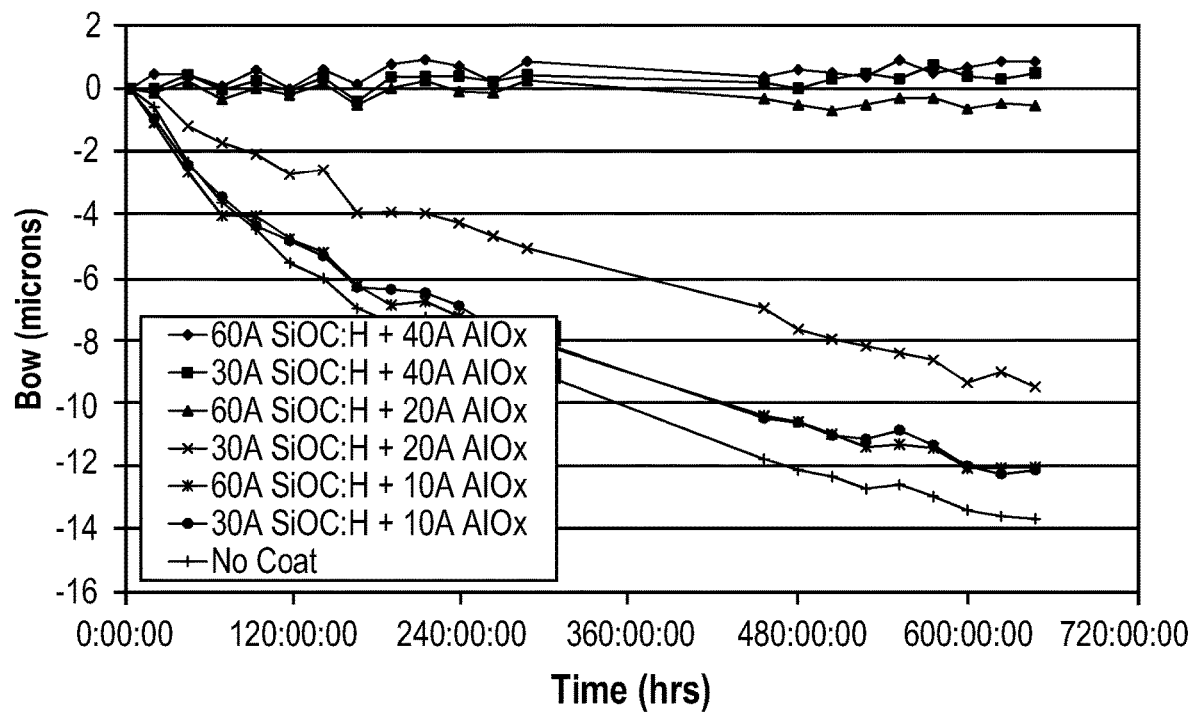

FIGS. 3A-3B illustrate line graphs for experimental evaluations of dielectric diffusion barrier embodiments, in accordance with embodiments of the present invention. Stress measurements were collected for a film stack including the dielectric diffusion barrier treatment over a thick moisture absorbing oxide which registers a change in stress measured via wafer bow and correlated with moisture content. The FIG. 3A shows a flat line trend for an ALD layer of $Al_2O_3$ of 6 nm and greater serve as a moisture diffusion barrier (hermetic barrier). For thicknesses below 6 nm, wafer bow changes over time indicating the moisture is penetrating the $Al_2O_3$ layer. FIG. 3B is a line graph for a SiON(C):H/AlO$_x$ bilayer dielectric diffusion barrier. As can be seen, a 6 nm SiON(C):H layer 2 nm AlO$_x$ layer shows little moisture absorption. This is represents more than a 60% reduction in thickness of the high-k $Al_2O_3$ needed to form a conformal barrier and therefore capacitance may be advantageously reduced while still providing an extremely thin hermetic barrier (e.g., 8 nm). For reference, at least 14 nm of SiON(C) is needed to provide similar results. In reference to embodiments of a silicon alloyed metal oxide diffusion barrier (e.g., metal silicate), though not explicitly depicted in a plot it is noted that because SiON layer with an oxygen content twice the nitrogen content has been found to maintain a hermeticity equivalent of SiN compositions, it is expected that metal silicate (e.g., aluminosilicates, $Al_{1-y}Si_yO_x$, magnesiosilicates ($Mg_{1-y}Si_yO_x$), etc.) films where up to 50% of the metal species is replaced by Si will also maintain the hermeticity of the corresponding metal oxide.

Figure 4:
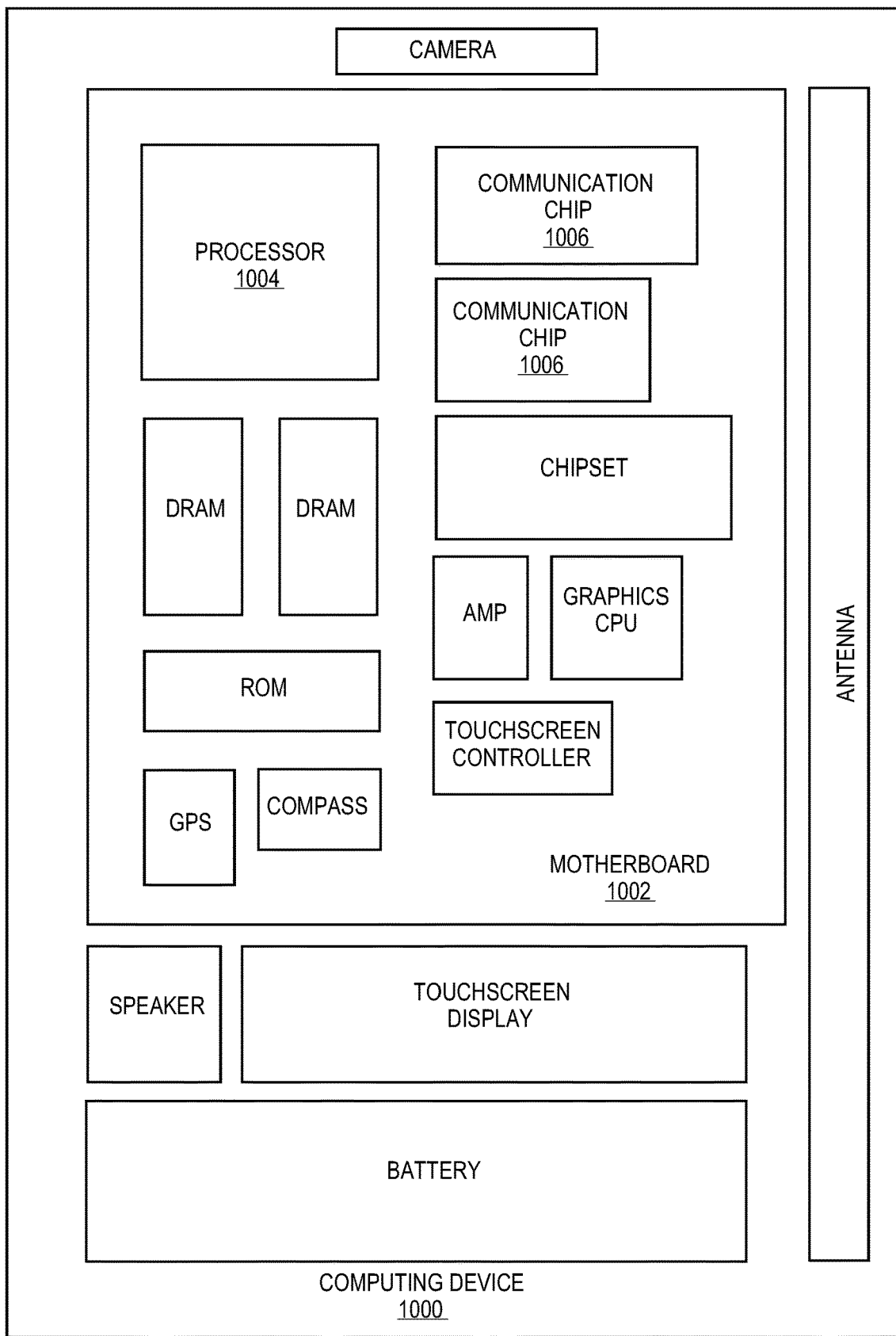
FIG. 4 is a functional block diagram of a mobile computing platform which may incorporate ICs fabricated in accordance with the method illustrated by FIGS. 1 and 2A-2G.

FIG. 4 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations, at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as metal interconnects with a dielectric diffusion barrier disposed there between as described elsewhere herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices such as metal interconnects with a dielectric diffusion barrier disposed there between as described elsewhere herein.

In further implementations, another component housed within the computing device 1000 may contain an integrated circuit die that includes one or more devices, such as metal interconnects with a dielectric diffusion barrier disposed there between as described elsewhere herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:
1. An integrated circuit structure, comprising:
   a first metal interconnect structure in a first low-k inter-layer dielectric (ILD) layer above a substrate;
   a second metal interconnect structure in the first low-k inter-layer dielectric (ILD) layer;
   a trench in the first low-k ILD layer, the trench between the first metal interconnect structure and the second metal interconnect structure;
   an air gap in the trench;
   a hardmask layer directly on the first metal interconnect structure;

an moderate-k dielectric layer directly on the hardmask layer, the moderate-k dielectric layer having a dielectric constant greater than a dielectric constant of the hardmask layer;

a metal oxide layer directly on the moderate-k dielectric layer, the metal oxide layer having a dielectric constant greater than the dielectric constant of the moderate-k dielectric layer; and a second low-k ILD layer directly on the metal oxide layer.

2. The integrated circuit structure of claim 1, wherein the moderate-k dielectric layer is further in the trench, the moderate-k dielectric layer between the air gap and the first metal interconnect structure, and the moderate-k dielectric layer between the air gap and the second metal interconnect structure.

3. The integrated circuit structure of claim 1, wherein the second low-k ILD layer is further in the trench.

4. The integrated circuit structure of claim 1, further comprising:

a conductive via in the second low-k ILD layer and through an opening in the metal oxide layer, the moderate-k dielectric layer and the hardmask layer, the conductive via directly on and electrically coupled to the first metal interconnect structure.

5. The integrated circuit structure of claim 1, wherein the metal oxide layer comprises aluminum and oxygen.

6. The integrated circuit structure of claim 1, wherein the moderate-k dielectric layer comprises silicon, oxygen and carbon.

7. The integrated circuit structure of claim 1, wherein the hardmask layer comprises silicon and nitrogen.

8. The integrated circuit structure of claim 1, wherein the second low-k ILD layer comprises silicon, oxygen and carbon.

9. The integrated circuit structure of claim 1, wherein the second low-k ILD layer has a dielectric constant in the range of 2.5-3.1.

10. The integrated circuit structure of claim 1, wherein the first low-k ILD layer has a dielectric constant in the range of 2.5-3.2.

11. The integrated circuit structure of claim 10, wherein the first low-k ILD layer comprises silicon, oxygen, carbon and hydrogen.

12. The integrated circuit structure of claim 1, wherein the first low-k ILD layer comprises silicon, oxygen, carbon and hydrogen.

13. A computing device, comprising:

a board; and a component coupled to the board, the component including an integrated circuit structure, comprising:

a metal interconnect structure in a first low-k inter-layer dielectric (ILD) layer above a first metal interconnect structure in a first low-k inter-layer dielectric (ILD) layer above a substrate;

a second metal interconnect structure in the first low-k inter-layer dielectric (ILD) layer;

a trench in the first low-k ILD layer, the trench between the first metal interconnect structure and the second metal interconnect structure;

an air gap in the trench;

a hardmask layer directly on the first metal interconnect structure;

a moderate-k dielectric layer directly on the hardmask layer, the moderate-k dielectric layer having a dielectric constant greater than a dielectric constant of the hardmask layer;

a metal oxide layer directly on the moderate-k dielectric layer, the metal oxide layer having a dielectric constant greater than the dielectric constant of the moderate-k dielectric layer; and a second low-k ILD layer directly on the metal oxide layer.

14. The computing device of claim 13, further comprising:

a memory coupled to the board.

15. The computing device of claim 13, further comprising:

a communication chip coupled to the board.

16. The computing device of claim 13, further comprising:

a camera coupled to the board.

17. The computing device of claim 13, further comprising:

a battery coupled to the board.

18. The computing device of claim 13, further comprising:

an antenna coupled to the board.

19. The computing device of claim 13, further comprising:

a global positioning system coupled to the board.

20. The computing device of claim 13, wherein the component is a packaged integrated circuit die.

* * * * *